(12) United States Patent
Trezza et al.

(10) Patent No.: US 6,656,757 B2
(45) Date of Patent: Dec. 2, 2003

(54) ELECTRO-OPTICAL TRANSCEIVER SYSTEM WITH CONTROLLED LATERAL LEAKAGE AND METHOD OF MAKING IT

(75) Inventors: John A. Trezza, Nashua, NH (US); Gregory K. Dudoff, Amherst, NH (US)

(73) Assignee: Teraconnect, Inc., Nashua, NH (US)

(*) Notice: Subject to any disclaimer, the term of this patent is extended or adjusted under 35 U.S.C. 154(b) by 0 days.

(21) Appl. No.: 10/241,991

(22) Filed: Sep. 12, 2002

(65) Prior Publication Data

US 2003/0092208 A1 May 15, 2003

Related U.S. Application Data

(62) Division of application No. 10/016,382, filed on Dec. 10, 2001, which is a division of application No. 09/653,378, filed on Sep. 1, 2000, now Pat. No. 6,344,664.

(51) Int. Cl.[7] ............................................. H01L 21/00
(52) U.S. Cl. ............................. 438/24; 438/28; 372/50
(58) Field of Search ................................ 438/22, 24, 28, 438/25, 29; 257/79, 80

(56) References Cited

U.S. PATENT DOCUMENTS

| 5,291,038 A |   | 3/1994  | Hanamoto et al. |        |
|-------------|---|---------|-----------------|--------|
| 5,578,162 A |   | 11/1996 | D'Asaro et al.  |        |
| 5,608,264 A |   | 3/1997  | Gaul            |        |
| 5,621,225 A | * | 4/1997  | Shieh et al.    | 257/81 |
| 5,723,363 A |   | 3/1998  | Wiese           |        |
| 5,780,875 A |   | 7/1998  | Tsuji et al.    |        |
| 5,818,404 A | * | 10/1998 | Lebby et al.    | 345/82 |
| 5,818,984 A |   | 10/1998 | Ahmad           |        |
| 5,858,814 A |   | 1/1999  | Goossen et al.  |        |
| 5,898,806 A |   | 4/1999  | Nishimoto       |        |
| 6,184,066 B1 | * | 2/2001  | Chino et al.    | 438/118 |
| 6,214,642 B1 | * | 4/2001  | Chen et al.     | 438/108 |
| 6,333,522 B1 | * | 12/2001 | Inoue et al.    | 257/99  |
| 6,337,265 B1 | * | 1/2002  | Trezza et al.   | 438/612 |
| 6,344,664 B1 | * | 2/2002  | Trezza et al.   | 257/82  |
| 2002/0081760 A1 | * | 6/2002 | Whatmore      | 438/25  |

OTHER PUBLICATIONS

Marsan, Ajmone, M. et al, Modelling Slotted Multi–Channel Ring All–Optical Networks, IEEE, 1997, pp. 146–153.

Marsan, Ajmone, Marco et al, Access Protocols for Photonic WDM Multi–Rings with Tunable Transmitters and Fixed Receivers, *SPIE*, pp. 59–72, vol. 26921.

Beckmann, Carl, Applications: Asynchronous Transfer Mode and Synchronous Optical Network, *Handbook of Fiber Optic Data Communication*, 1998, pp. 385–414, Academic Press.

Ross, Floyd E., An Overview of FDDI: The fiber Distributed Data Interface, IEEE Journal on Selected Areas in Communications, Sep. 1989, pp. 1043–1051, vol. 7, No. 7.

PCT International Search Report dated Jul. 12, 2001 of International Application No. PCT/US00/42433 filed Dec. 1, 2000.

(List continued on next page.)

*Primary Examiner*—Carl Whitehead, Jr.
*Assistant Examiner*—William Vesperman
(74) *Attorney, Agent, or Firm*—Maine & Asmus (57) ABSTRACT

An electro-optical transceiver system with controlled lateral light leakage and a method of making such a system includes a plurality of emitter devices and detector devices including at least one of each, arranged in a planar array for transmitting and receiving, respectively, energy in a predetermined wavelength and a blocking medium disposed interstitially of the devices and being absorbing at the predetermined wavelength for blocking energy at the predetermined wavelength laterally leaking from an emitter device to one or more detector devices.

7 Claims, 6 Drawing Sheets

OTHER PUBLICATIONS

Krishnamoorthy, Ashok V., Firehose Architectures for Free–Space Optically–Interconnected VLSI Circuits, Special Issue on Parallel Computing with Optical Interconnects. Journal of Parallel and Distributed Computing, Nov. 1996, pp. 1–10 complete article also see marked up cover and p. 6 included.

Travers, Christine M. et al., VLSI Photonic Smart Pixel Array for I/O System Architectures. publ Jan. 1998. This is best copy found.

Kitayama, Ken–Ichi et al, Two Dimensional Parallel Optical Data Link: Experiment* IEEE, 1996 pp. 206–214.

Neff, John A. et al. VCSEL/CMOS Smart Pixel Arrays for Free Space Optical Interconnects, IEEE 1996 pp. 282–289.

Kosaka, Hideo et al., Plastic–Based Receptacle–Type VCSEL–Array Modules with One and Two Dimensions Fabricated Using the Self Allignment Mounting Technique, IEEE 1987 or 1997 pp. 382–385 This is best copy found.

No Author, ──────Smart Pixel Array (SPA) for VLSI–Photonics, DARPA website, this is the best copy found.

* cited by examiner

*FIG. 15*

ELECTRO-OPTICAL TRANSCEIVER SYSTEM WITH CONTROLLED LATERAL LEAKAGE AND METHOD OF MAKING IT

CROSS REFERENCE TO RELATED APPLICATIONS

This is a divisional application which claims priority under 35 U.S.C. §120 to co-pending patent application Ser. No. 10/016,382 filed Dec. 10, 2001, which is incorporated herein by reference for all purposes and which in turn is a divisional application which claims priority under 35 U.S.C. §120 to U.S. Pat. No. 6,344,664, which was a co-pending application with Ser. No. 09/653,378 filed Sep. 01, 2000 which is incorporated herein by reference for all purposes.

BACKGROUND OF INVENTION

Technical Field of the Invention

Computers and related peripheral equipment, satellite and communication systems are becoming ever more sophisticated and powerful. However, data transfer into and out of processors remains a limiting factor. The combination of increased parallelism and optics is the focus of optical interconnect technology. One approach to optical interconnect technology uses so-called flip-chip techniques where the advantages of silicon process technology are combined with the optical properties of III-V semiconductor materials. In this technology, emitter-detector arrays are fabricated separately from a CMOS substrate. The emitter-detector arrays are then inverted, aligned with the CMOS substrates and secured in place using solder balls to form electrical contacts and epoxy to rigidly mount the emitter-detector array to the CMOS chip. In one construction the CMOS chip contains emitters such as vertical cavity surface emitting lasers (VCSELs) and detectors such as p-i-n diodes. Most of the light emitted by an optoelectronic device such as a vertical cavity surface-emitting laser (VCSEL) leaves the immediate vicinity of the emitter vertically. However, some light leaks laterally, and it can be detected by a nearby detector. This light adds noise to the signal received at that detector, which detracts from the overall performance of the system.

The light leakage contains some information about the optical signals being propagated through the system. In many devices, there is a need to make separate circuitry that uses that signal/information to enhance system performance, but such circuitry adds cost to the structure. Light leaking from an emitter to neighboring detectors constitutes a loss of optical power, which can adversely affect the performance of some systems, especially where the coupling is weak. The light that is lost can also decrease noise margins.

SUMMARY OF THE INVENTION

It is therefore an object of this invention to provide an improved electro-optical transceiver system with controlled lateral leakage and method of making it.

It is a further object of this invention to provide such an improved electro-optical transceiver system and method which blocks lateral leakage of light from emitters to detectors.

It is a further object of this invention to provide such an improved electro-optical transceiver system and method that directs, channels and controls the laterally leaked light.

It is a further object of this invention to provide such an improved electro-optical transceiver system and method that beneficially directly applies the laterally leaked light without electronic circuitry to enhance system performance.

It is a further object of this invention to provide such an improved electro-optical transceiver system and method which reduces cross-talk in the plane of the array of the transceivers.

It is a further object of this invention to provide such an improved electro-optical transceiver system and method which improves the signal to noise ratio.

It is a further object of this invention to provide such an improved electro-optical transceiver system and method which effects control of the lateral light leakage as an integrated part of the integrated circuit fabrication process and with minimal additional steps.

An object is a method for integration of controlled lateral light leakage photonic devices on an integrated circuit comprising flip-chip bump bonding a first substrate having first photonic devices to a second substrate having second photonic devices; and filling voids between the first and second substrate interstitially of the photonic devices with an underfill, wherein a portion of the underfill blocks a wavelength of light.

Objects include, the method for integration of photonic devices, wherein the wavelength of light is that of the photonic devices. And, further comprising the step of building a blocking medium with the underfill, building one or more transmissive channels in the blocking medium, and/or, wherein said portion of the underfill is placed around one or more sides of one or more of the photonic devices. Furthermore, wherein the first and second substrate form a first planar array and further comprising the steps of stacking one or more planar arrays on the first planar array, wherein the underfill blocks the wavelength of light in three dimensions.

An object of the invention is a method for integration of photonic devices on integrated circuits, comprising providing an array of first photonic devices including dummy devices mounted on a first substrate, providing an array of contacts on a second substrate and flip-chip bonding the first photonic devices to the contacts. Filling the voids between the substrates interstitially of the first photonic devices with a first underfill; removing the first substrate, masking the first photonic devices leaving exposed pre-selected dummy devices, removing the dummy devices and the associated first underfill and preserving the first underfill associated with the masked first photonic devices leaving an array of holes with contacts. And, providing a spaced array of second photonic devices on a third substrate matching the array of holes, flip-chip bonding the second photonic devices to the contacts in the holes, and filling the voids between the substrates associated with the second photonic devices with a second underfill, at least a portion of the second underfill being absorptive at the wavelength at which the photonic devices operate for controlling lateral light leakage between the first and second photonic devices.

An additional object is the method for integration of photonic devices, wherein at least a portion of the first underfill is absorptive at the wavelength at which the photonic devices operate for controlling lateral light leakage between the first and second photonic devices in the plane of the array. In addition, wherein at least a portion of the first underfill and second underfill form a blocking medium, and, further comprising one or more transmissive channels in the blocking medium.

Yet a further object is the method for integration of photonic devices, wherein the first and second substrate is composed from the group comprising gallium arsenide, silicon, indium phosphide, indium gallium arsenide nitride, silicon germanium, and gallium arsenide. Furthermore, wherein said underfill is comprised from the group comprising an epoxy and a photoresist.

An object includes the method for integration of photonic devices, wherein said second substrate includes an application specific integrated circuit. Another object is wherein one of the first and second devices includes light emitters and the other includes light detectors. Also, wherein one of the first and second devices includes vertical cavity surface emitting lasers and the other includes p-i-n diodes. And, wherein the dummy devices are the same as the first devices.

And, an object includes the method for integration of photonic devices, further comprising the step of removing the first substrate except for said first devices. Additionally, further comprising the step of removing the third substrate except for the second devices.

The invention results from the realization that an improved electro-optical transceiver system with controlled lateral light leakage and method of making it can be achieved by disposing a blocking medium interstitially of the emitter and detector devices in the planar array comprising the transceiver system, which blocking medium absorbs light at the wavelengths at which the emitters and detectors operate to isolate or at least control the lateral light leakage between the emitters and detectors in the plane of the array.

This invention features an electro-optical transceiver system with controlled lateral light leakage. There is a plurality of emitter devices and detector devices including at least one of each arranged in a planar array for transmitting and receiving, respectively, energy in a predetermined wavelength. A blocking medium disposed interstitially of the devices and being absorbing at the predetermined wavelength blocks energy at the predetermined wavelength laterally leaking from an emitter device to one or more of the detector devices.

In a preferred embodiment the blocking medium may include a transmissive medium channel for transmitting energy at the predetermined wavelength to the blocking medium between selected devices in the plane of the array. The blocking medium may surround at least one emitter device in the plane of the array. It may surround at least one detector device in the plane of the array; it may surround each emitter device in the plane of the array; it may surround each detector device in the plane of the array. The emitter devices may be vertical cavity surface emitting lasers. The detectors may be p-i-n diodes. The blocking medium may include an epoxy; the blocking medium may surround pre-selected pairs of emitter and detector devices; the blocking medium may include an underfill for supporting the chips. There may be a number of stacked planar arrays of emitters and detectors and the blocking medium may include a transmissive medium channel for transmitting energy at the predetermined wavelength through the blocking medium between selected devices in different planar arrays.

The invention also features a method for integration of photonic devices on integrated circuits including providing an array of first photonic devices including dummy devices on a first chip; providing an array of contacts on the second chip; and flip chip bonding the first photonic devices to the contacts. The voids between the chips interstitial of the first photonic devices may be filled with an underfill. The first photonic devices may be masked leaving exposed pre-selected dummy devices. The dummy devices and the associated underfill may be removed while the underfill associated with masked photonic devices is preserved and there is left an array of holes with contacts. A spaced array of second photonic devices on a third chip is provided matching the array of holes. The second photonic devices are then flip chip bonded to the contacts in the holes. The voids between the chips associated with the second photonic devices are filled with an underfill. At least a portion of the underfills is absorbing at the wavelength at which the photonic devices operate for controlling lateral light leakage between first and second devices in the plane of the array.

In a preferred embodiment, the first and third chips may include gallium arsenide and the second chip may include silicon. The second chip may include an application specific integrated circuit. One of the first and second devices may include light emitters and the other light detectors. One of the first and second devices may include vertical cavity surface emitting lasers and the other may include p-i-n diodes. The dummy devices may be the same as the first devices. The first and third chips may include indium phosphide or indium gallium arsenide nitride. The second chip may include silicon germanium or gallium arsenide. The underfill may include an epoxy. The first chip may be removed except for the first devices and the third chip may be removed except for the second devices.

The invention also features a method for integration of low lateral light leakage photonic devices on an integrated circuit including flip chip bump bonding a first chip having first photonic devices to a second chip having second photonic devices and filling the voids between the chips interstitially of the devices with an underfill at least a portion of which blocks light at the wavelength at which the photonic devices operate.

Still other objects and advantages of the present invention will become readily apparent to those skilled in this art from the following detailed description, wherein only a preferred embodiment of the invention is described, simply by way of illustration of the best mode contemplated for carrying out the invention. As will be realized, the invention is capable of other and different embodiments, and its several details are capable of modifications in various obvious respects, all without departing from the invention.

BRIEF DESCRIPTION OF THE DRAWINGS

The present invention will be readily understood by the following detailed description in conjunction with the accompanying drawings, wherein like reference numerals designate like structural elements, and in which.

PREFERRED EMBODIMENT

Figure 1:
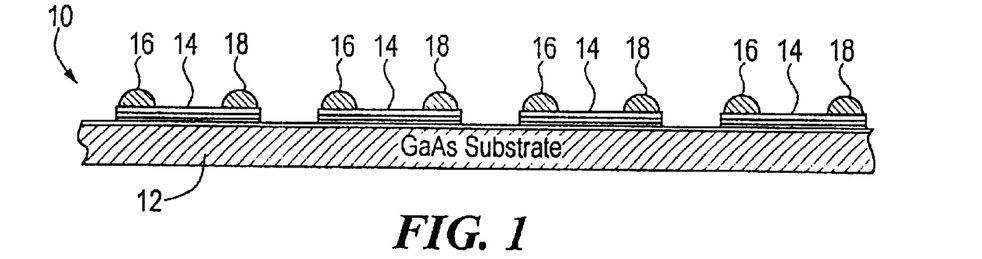
FIG. 1 is a schematic side elevational sectional view of a first chip according to this invention.

There is shown in FIG. 1 a first chip 10 including a GaAs substrate 12 having grown on it a number of vertical cavity surface emitting laser (VCSEL) emitters 14. Mounted on each of the VCSELs 14 are a number of solder balls or bumps two of which are shown 16 and 18. Some of these devices 14 are actually dummy devices and will be removed as seen subsequently with respect to FIGS. 5 and 6.

Figure 2:
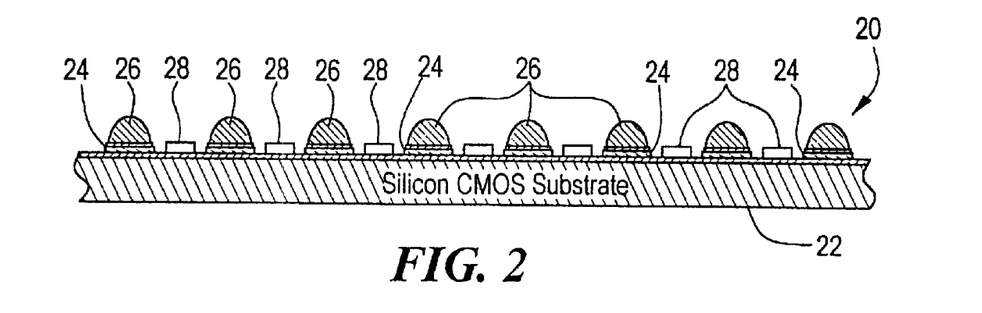
FIG. 2 is a schematic side elevational sectional view of a second chip according to this invention.

The second chip 20, FIG. 2, includes a silicon CMOS substrate 22 which carries a number of metal landing pads 24 each containing a solder ball or bump 26 so arranged that they mate with the solder bumps 16 and 18 of chip 10, FIG. 1. Also shown on chip 20 are portions 28 of an electronic circuit in this case an application specific integrated circuit (ASIC).

Figure 3:
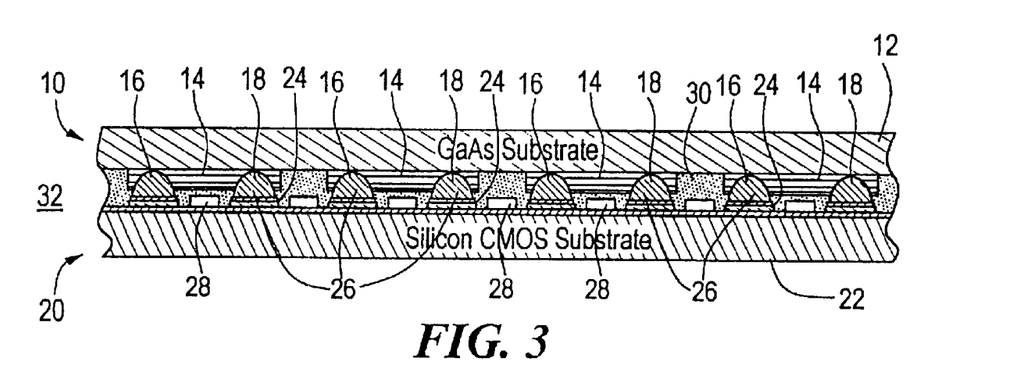
FIG. 3 is a schematic side elevational sectional view of a first chip bump bonded to the second chip and underfilled.

The first chip 10, FIG. 1 is flip-chipped and bump bonded onto the second chip 20 as shown in FIG. 3 and filled with an underfill 30 such as an epoxy, a photoresist, or any other suitable flowable hardener. Underfill 30, FIG. 3, fills the voids between the two chips and interstitially of the devices to complete the formation of assembly 32. Emitters 14 make electrical contact to the CMOS logic or the ASIC 28 on silicon CMOS substrate 22 through the use of the solder balls 16, 18, 26 and the metal landing pads 24. In this particular case all of the devices are identical being VCSELs grown on the same gallium arsenide substrate with the same layer construction.

The process steps following this involve mechanically and chemically removing the gallium arsenide substrate until the top surfaces of the emitters are exposed so that they can freely emit laser light in this particular case at a wavelength of 850 nm. Throughout the processing the underfill serves to provide physical stability for the emitters during the substrate removal and subsequent steps.

Figure 4:
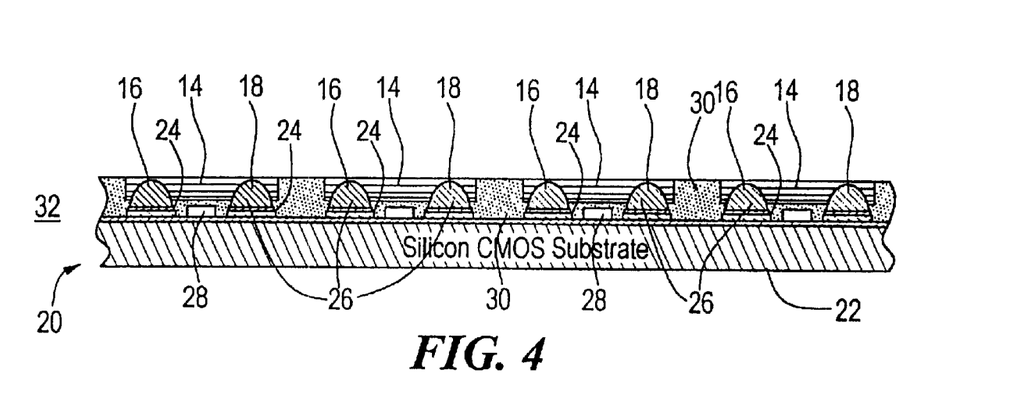
FIG. 4 is a schematic side elevational sectional view of a flip-chip assembly of FIG. 3 with the first chip removed except for the devices.

Gallium arsenide substrate 12 of the first chip 10 of is now removed by mechanical techniques, followed with chemical etching with $SF_6/SiCl_4$ or other dry etch process so that essentially all that is left of the first chip are the emitters 14, FIG. 4.

In this embodiment, it is intended that the emitters be integrated by interdigitation with laser detectors that have been grown on a separate gallium arsenide substrate. The optical devices do not however have to be grown on gallium arsenide substrates. In fact, they could be grown on InP or InGaAsN substrates or any combinations of substrates onto which light emitting or detecting devices can typically be grown. This could be accomplished by spacing the emitters much farther apart to accommodate insertion of the detectors, removing the epoxy, and performing a number of flip-chip process steps to deposit the detectors. In contrast, the method presented here employs a photolithographic step that applies a protective mask over those emitters that are to remain while leaving exposed certain of the emitters that are really dummy devices or blanks provided solely to reserve space for placement of the detectors. Once the protective mask has been applied, a further chemical etching is performed to remove the dummy devices but not the real devices or their associated underfill. In this way the epoxy resin is never removed so it continues to provide mechanical stability to the emitters that remain on the silicon substrate. Note that since the dummy devices do not actually remain as active components in the final product, they do not necessarily have to take the form of the emitter devices as they do here. Rather the dummies could be simply blank regions of gallium arsenide material or anything else that is formed between the active emitter devices and shaped so that when removed an opening or hole is formed that is compatible with the device (the detector in this case) which is to be later inserted or deposited.

Figure 5:
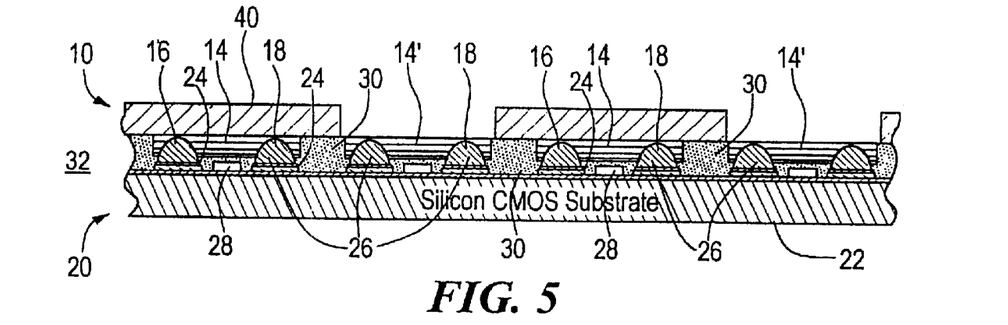
FIG. 5 is a schematic side elevational sectional view of the flip-chip assembly of FIG. 4 with a mask applied to expose dummy devices.
Figure 6:
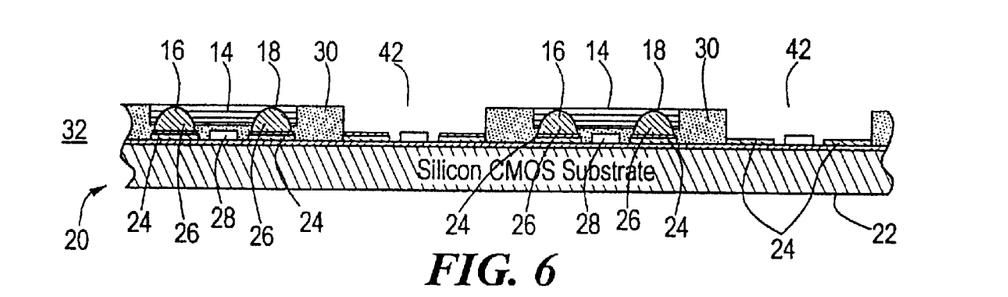
FIG. 6 is a schematic side elevational sectional view of the flip-chip assembly of FIG. 5 with the mask and dummy devices removed.
Figure 7:
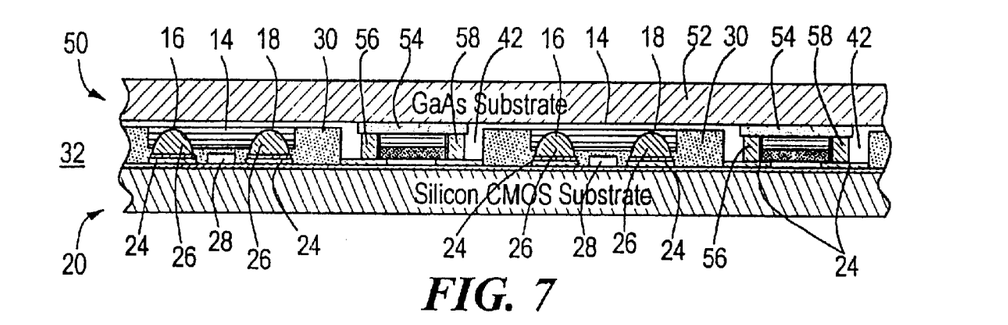
FIG. 7 is a schematic side elevational sectional view of a third chip flip-chip with a second type of device flip-chip bonded to the assembly of FIG. 6 with the second type of devices in the holes left by removal of the dummy devices.
Figure 8:
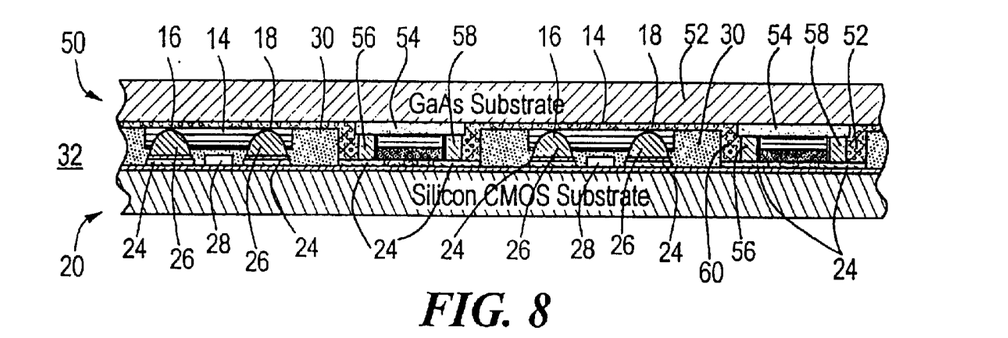
FIG. 8 is a view similar to FIG. 7 with underfill applied again.
Figure 9:
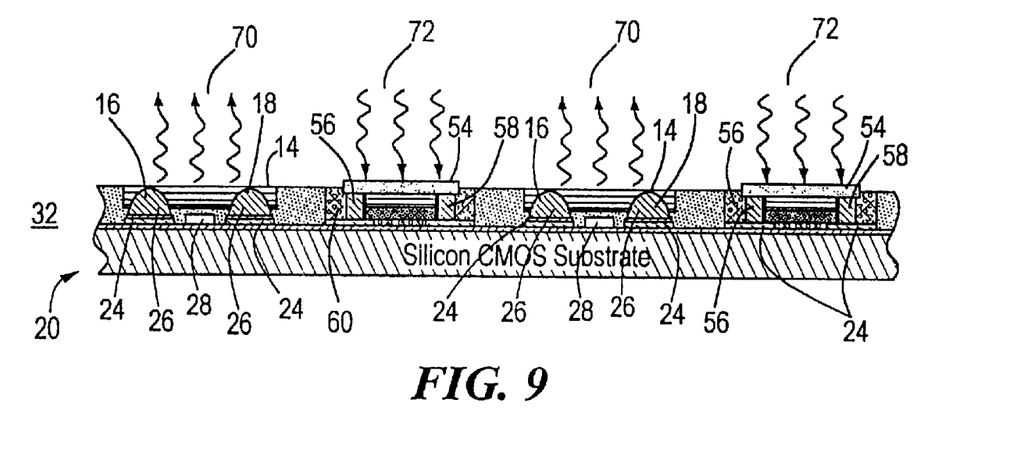
FIG. 9 is a view similar to FIG. 8 of an integrated circuit with two different types of devices on it according to this invention.

A photoresist mask 40, FIG. 5 now covers those of detectors 14 which are to be preserved and exposes those 14' which function as dummies and are to be removed. The photoresist may be AZ4620 or other standard resist. The exposed dummy devices 14' are then removed by wet etching with a bromine solution, such as $Br_2/HBr/H_2O$, leaving holes 42, FIG. 6, with remaining metal landing pads 24. The photoresist is also removed using acetone. The third chip 50, FIG. 7, having a gallium arsenide substrate 52 with p-i-n diode detectors 54 grown on it is flip-chip bump bonded to the assembly 32 by aligning its detectors 54 with holes 42 and engaging solder balls or bumps 56, 58 with pads 24 in each of holes 42. An underfill such as an epoxy or a photoresist or other suitable material 60 is applied once again to fill the spaces between chips 50 and 20 surrounding the detectors 54 and other open areas as shown in FIG. 8. The third substrate 52 is then removed by use of the same mechanical and chemical etching as above resulting in the completed assembly 32, FIG. 9 in which all of this gallium arsenide substrate 52 is removed except for the detectors 54.

Figure 10A:
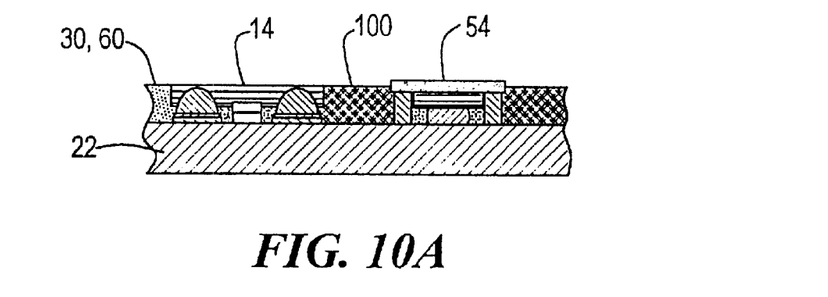
FIGS. 10A and B are schematic side elevational sectional views of the integrated circuit of FIG. 9 illustrating different applications of the blocking medium to block lateral light leakage in the plane of the array according to this invention.
Figure 10B:
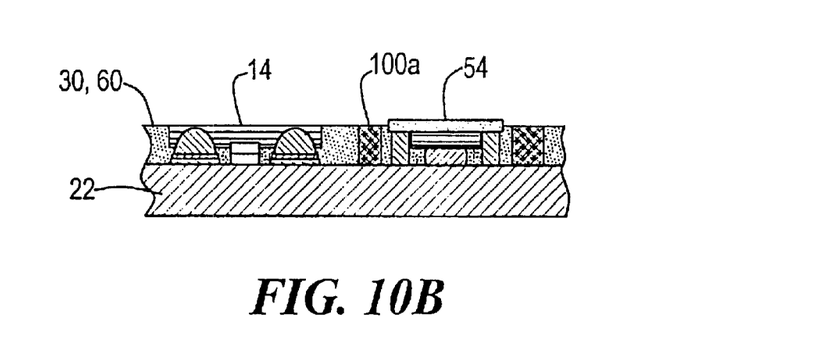
Figure 11A:
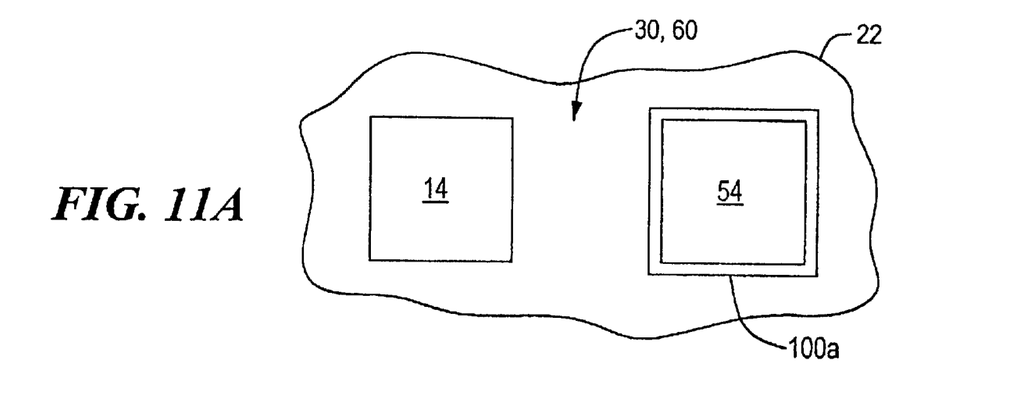
FIGS. 11A, B and C are schematic top plan views of an emitter and a detector in a planar array with one, the other and both being bounded by a blocking medium to block lateral light leakage in the plane of the array.

In accordance with this invention, the underfills 30, 60 may be an epoxy and at least a portion of it may be an epoxy which blocks radiation at the operating wavelength of the emitters and detectors, for example, a wavelength of 850 nm in which case the blocking medium would contain an epoxy which absorbs well at this wavelength. There is shown in FIG. 10A a portion of a planar array containing a single emitter 14 and detector 44 which are surrounded by underfills 30, 60, a portion of which includes a blocking medium 100. Blocking medium 100 does not have to fill all the space between detector 54 and emitter 14. For example, it could be just a minimal boundary 100a FIG. 10B, surrounding the detector 54 which is shown more clearly in the plan view of FIG. 11A.

Figure 11B:
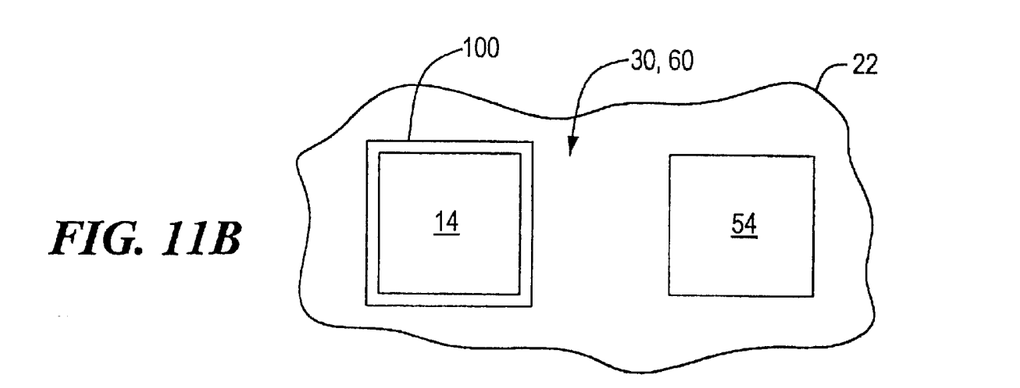
Figure 11C:
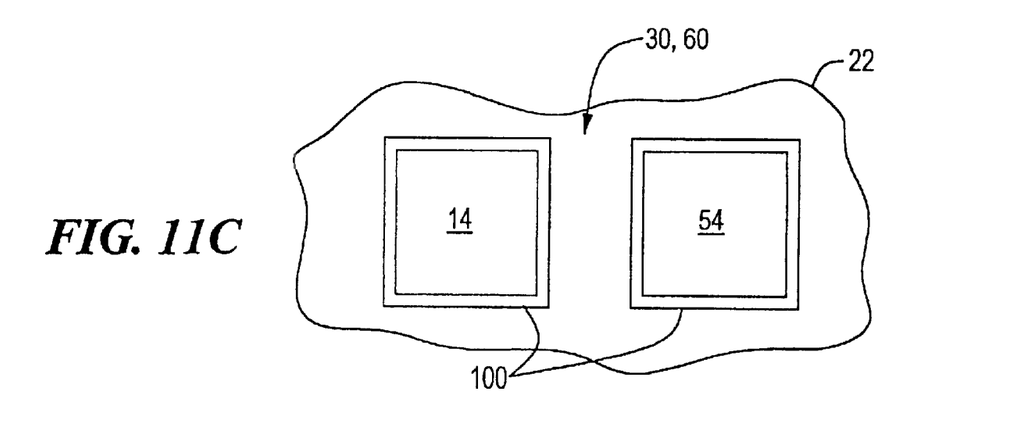
Figure 12:
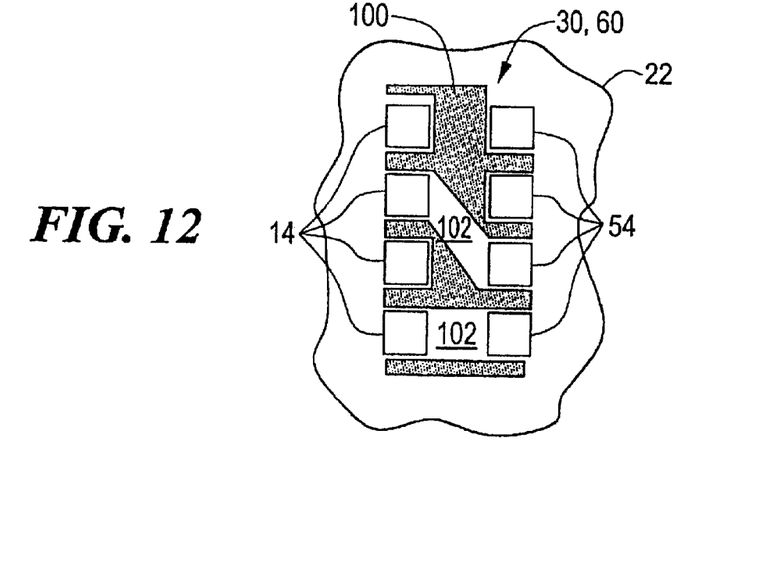
FIG. 12 is a top plan view of a number of emitters and detectors in a planar array in which transmissive mediums have been disposed in the blocking mediums to channel or control lateral leakage light between selected emitters and detectors.
Figure 13:
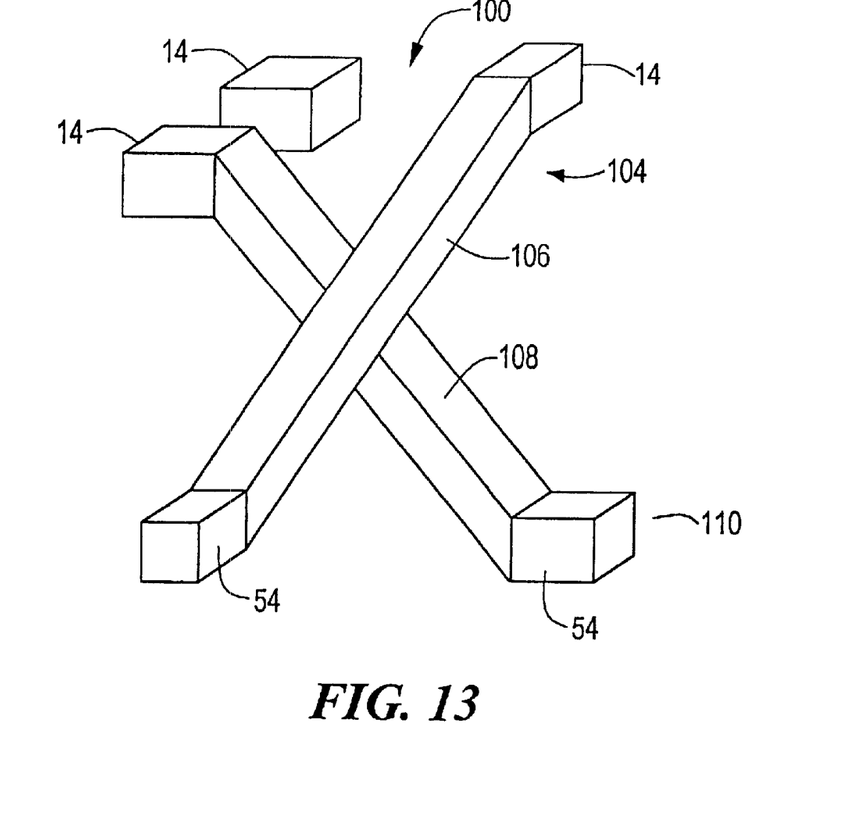
FIG. 13 is a view of a three dimensional array of emitters and detectors with a transmissive medium within the blocking medium forming channels to control the lateral light leakage in three dimensional space.

In practice, the blocking medium need not be placed around the detector 54, but could be placed around the emitter 14 as shown in FIG. 11B or could be placed around both as shown in FIG. 11C. In the planar array, a portion of which is shown in FIG. 12, the blocking medium 100 may have disposed in it channels of transmissive medium 102 so that selected ones of detectors 54 may be protected from the lateral light leakage from emitter 14 and yet certain of them may be purposely exposed to the lateral light leakage from specific emitters through the use of the transmissive channels 102. Although generally thus far, the invention has been described with respect to a planar array, this is not always a necessary limitation, as the planar arrays could be stacked one on top of another. In that case, as shown in FIG. 13, emitters and detectors in one or more stacked arrays in a three dimensional arrangement could be connected to emitters and detectors in another planar array. For example, as shown in FIG. 13, two emitters 14 in a first array 104 are connected through transmissive medium channels 106 and 108 to detectors 54 in another planar array 10. In FIG. 13, the space between emitters 14 on array 104 and detectors 54 on array 110 are filled with an underfill that includes a blocking medium 100 as is the space between the arrays 104 and 110 so that the transmissive medium channels 106 and 108 act as light pipes. For this purpose they may have an index refraction that is greater than that of the surrounding blocking medium. Although in this three dimensional configuration, array 104 has all emitters and array 110 has all detectors, this is not a necessary limitation as they can be mixed on either or both planes as indicated previously in this description.

Figure 14:
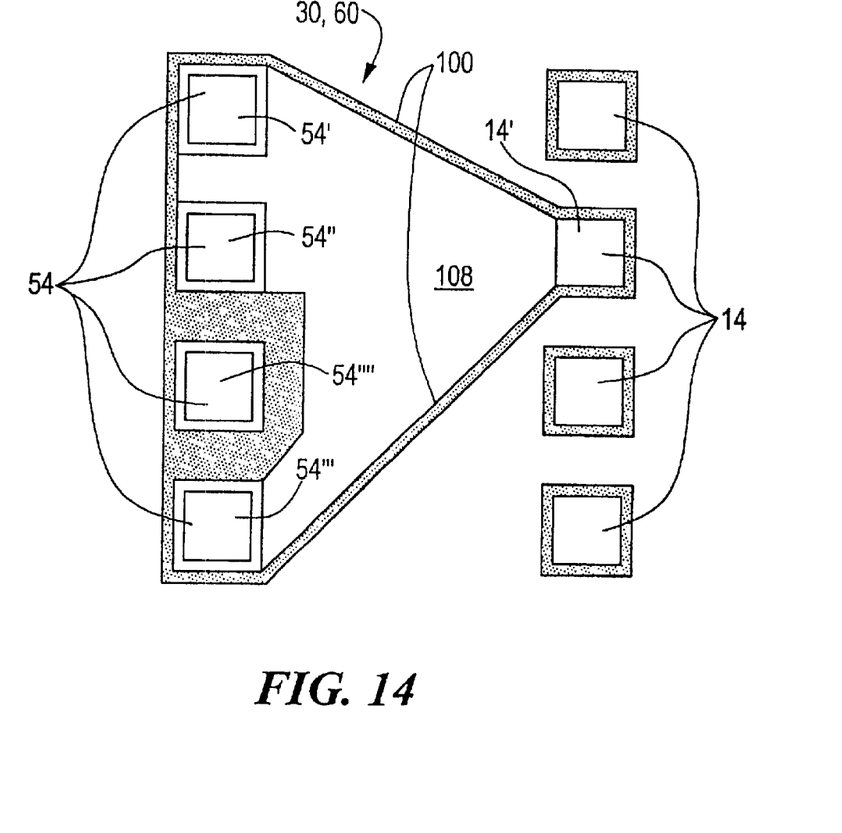
FIG. 14 is a schematic top plan view of a planar array of emitters and detectors with blocking and transmissive mediums configured to control selected detectors with lateral light leaked from a specific emitter.

Another advantageous application of this invention is depicted in FIG. 14 where it can be seen that a particular one of emitters 14 referred to as 14' is connected to transmitters 54', 54'' and 54''' by means of a transmissive medium channel 108, but is blocked from detector 54'''' by virtue of the fact that it is surrounded by blocking medium 100 as is transmissive medium channel 108 and emitter 14'. This causes any lateral light leakage from emitter 14' to be sensed by detectors 54', 54'' and 54''' directly. This can be used to a number of effects, one of which, for example, is that the operation of detectors 54', 54'' and 54''' can be synchronized with the operation of emitter 14'' directly and without the use of electronic circuits.

Figure 15:
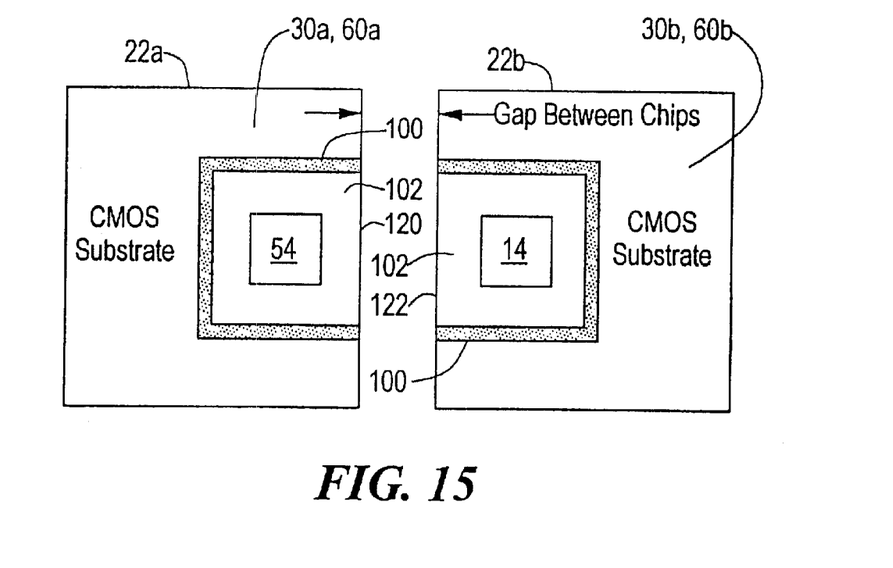
FIG. 15 is a schematic top plan view of an emitter and detector on different chips with a blocking medium controlling lateral light leakage between them.

Although thus far the use of the blocking medium to control lateral light leakage has been explained with respect to photonic devices on a single chip, this is not a necessary limitation of the invention. It can be used to control the lateral light leakage between photonic devices on different chips or different systems entirely, as shown with respect to FIG. 15 where detector 54 on chip 22a is surrounded by blocking medium 100 on three sides but open along its edge 120 and emitter 14 on chip 22b is surrounded on three sides by blocking medium 100 with its side along the edge 122 of chip 22b uncovered. Thus, chips 22a and 22b can be drawn together until their edges 120 and 122 touch in which case lateral light from emitter 14 is conducted through transmissive medium 102 on each chip. In this way, the lateral leakage light from emitter 14 is constrained to effect detector 54 and only detector 54 on the neighboring chip.

An embodiment of the present invention is a method for integration of photonic devices having the steps of: providing an array of first photonic devices, surrounding the first photonic devices, at least partially, with a blocking medium absorptive at an operative wavelength of the first photonic devices; providing an array of second photonic devices; surrounding the second photonic devices, at least partially, with the blocking medium absorptive at an operative wavelength of said second photonic devices; and forming optically transmissive medium channels in the blocking medium, in such a way that the transmissive medium channels are disposed in such a way as to communicate between the first photonic devices and the second photonic devices.

The blocking medium of this embodiment may be limited to a minimum boundary surrounding the first and second photonic devices. The transmissive medium channels of this embodiment may have a higher refractive index than the surrounding blocking medium. The first and second photonic devices may be disposed in a single plane.

The array of first photonic devices may be disposed in a different plane than said array of second photonic devices or on a separate proximately disposed chip from said array of second photonic array.

Another embodiment of the present invention is method for integration of photonic devices on integrated circuits, having the following steps: providing an array of first photonic devices including dummy devices mounted on a first substrate; providing an array of contacts on a second substrate; providing an array of second photonic devices mounted on a third substrate; flip-chip bonding the first photonic devices to the contacts; filling the voids between the first and second substrate interstitially of the first photonic devices with a first underfill, at least a portion of the first underfill is absorptive at the wavelength at which the first photonic devices and the second photonic devices operate, thereby controlling lateral light leakage; removing the first substrate; masking the first photonic devices leaving exposed pre-selected dummy devices; removing the dummy devices and the associated first underfill and preserving the first underfill associated with the masked first photonic devices leaving an array of holes with contacts; flip-chip bonding the second photonic devices to the contacts in the holes; and filling the voids between the substrates associated with said second photonic devices with a second underfill, at least a portion of the second underfill being absorptive at the wavelength at which the first and second photonic devices operate for controlling lateral light leakage between the first and second photonic devices; using at least a portion of the first underfill and the second underfill to form a blocking medium having at least one transmissive channel in the blocking medium.

The first and second substrate may be composed from the group comprising gallium arsenide, silicon, indium phosphide, indium gallium arsenide nitride, silicon germanium, and gallium arsenide. The second substrate may include an application specific integrated circuit. The devices discussed above include light emitters and light detectors such as vertical cavity surface emitting lasers and p-i-n diodes. The dummy devices may be the same as said first devices. The underfill may be either an epoxy and a photoresist.

This embodiment may also include the additional steps of: removing said first substrate except for said first devices; removing said third substrate except for said second devices. The first and said second photonic devices may be disposed in a plurality of stacked planes or may be disposed in a single plane. The first and second photonic devices are surrounded by said blocking medium on three sides thereby disposed in such a way as to allow for the placement of a plurality of chips.

Another embodiment of the present invention is a method for integration of photonic devices on integrated circuits, having the step of forming a two dimensional array of photonic devices. This step is achieved by performing the substeps of: providing an array of first photonic devices including dummy devices mounted on a first substrate; providing an array of contacts on a second substrate; providing the array of second photonic devices on a third substrate; flip-chip bonding the first photonic devices to said contacts; filling the voids between the first and second substrate interstitially of the first photonic devices with a first underfill, wherein at least a portion of the first underfill is absorptive at the wavelength at which the first photonic devices and the second photonic devices operate for controlling lateral light leakage; removing the first substrate masking the first photonic devices leaving exposed preselected dummy devices; removing the dummy devices and the associated first underfill and preserving the first underfill associated with the masked first photonic devices leaving an array of holes with contacts; flip-chip bonding the second photonic devices to the contacts in the holes; and filling the voids between the substrates associated with the second photonic devices with a second underfill, at least a portion of the second underfill being absorptive at the wavelength at which the first and second photonic devices operate for controlling lateral light leakage between the first and second photonic devices; using at least a portion of the first underfill and the second underfill to form a blocking medium having at least one transmissive channel in the blocking medium.

This embodiment may further include the steps of: stacking a plurality of the two dimensional arrays of photonic devices, connecting the first and second photonic devices with at lease one of the transmissive channels thereby creating an interconnected three dimensional array of photonic devices.

The objects and advantages of the present invention may be further realized and attained by means of the instrumentalities and combinations particularly pointed out in the appended claims. Accordingly, the drawing and description are to be regarded as illustrative in nature, and not as restrictive.

Although specific features of the invention are shown in some drawings and not in others, this is for convenience only as each feature may be combined with any or all of the other features in accordance with the invention. The words "including", "comprising", "having", and "with" as used herein are to be interpreted broadly and comprehensively and are not limited to any physical interconnection. Moreover, any embodiments disclosed in the subject application are not to be taken as the only possible embodiments.

What is claimed is:

1. A method for integration of photonic devices comprising the steps of:

providing an array of first photonic devices;

surrounding said first photonic devices, at least partially, with a blocking medium absorptive at an operative wavelength of said first photonic devices;

providing an array of second photonic devices;

surrounding said second photonic devices, at least partially, with said blocking medium absorptive at an operative wavelength of said second photonic devices;

forming optically transmissive medium channels in said blocking medium, wherein said transmissive medium channels are disposed in such a way as to communicate between said first photonic devices and said second photonic devices.

2. The method for integration of photonic devices according to claim 1 wherein said first and second photonic devices have the same operating wavelength.

3. The method for integration of photonic devices of claim 1 wherein said blocking medium is limited to a minimum boundary surrounding said first and second photonic devices.

4. The method for integration of photonic devices of claim 1 wherein said transmissive medium channels have a higher refractive index than the surrounding blocking medium.

5. The method for integration of photonic devices of claim 1 wherein said first and second photonic devices are disposed in a single plane.

6. The method for integration of photonic devices of claim 1 wherein said array of first photonic devices is disposed in a different plane than said array of second photonic devices.

7. The method for integration of photonic devices of claim 1 wherein said array of first photonic devices is disposed on a separate proximately disposed chip from said array of second photonic array.

\* \* \* \* \*